United States Patent [19]
Hirata

[11] Patent Number: 5,592,429
[45] Date of Patent: Jan. 7, 1997

[54] COMPACT SEMICONDUCTOR MEMORY DEVICE CAPABLE OF PREVENTING INCOMPLETE WRITING AND ERASING

[75] Inventor: Masayoshi Hirata, Tokyo, Japan

[73] Assignee: NEC Corporation, Tokyo, Japan

[21] Appl. No.: 550,158

[22] Filed: Oct. 30, 1995

[30] Foreign Application Priority Data

Oct. 28, 1994 [JP] Japan .................................. 6-265563

[51] Int. Cl.$^6$ .................................................. G11C 16/06
[52] U.S. Cl. ............... 365/226; 365/185.29; 365/185.22; 365/189.07; 365/218
[58] Field of Search ........................ 365/189.07, 189.09, 365/185.09, 185.22, 218, 185.28, 185.29, 226; 327/540, 548

[56] References Cited

U.S. PATENT DOCUMENTS 5,200,920   4/1993   Norman et al. ..................... 365/185.22
5,436,913   7/1995   Yamamura et al. ................. 365/189.07
5,513,333   4/1996   Kynett et al. ....................... 365/189.07

FOREIGN PATENT DOCUMENTS

56114199     9/1981   Japan ................................. 365/189.07
60-236195   11/1985   Japan .
2118996      5/1990   Japan ..................................... 365/218
3292697     12/1991   Japan ..................................... 365/218
3296998     12/1991   Japan ..................................... 365/218
668687       3/1994   Japan ..................................... 365/218

*Primary Examiner*—Tan T. Nguyen
*Attorney, Agent, or Firm*—Foley & Lardner

[57] ABSTRACT

In a semiconductor memory device 100 including a power supply voltage decision circuit 101 for detecting whether or not the power supply voltage is higher than a predetermined level to produce an output signal LVD, an oscillator 102 which produces an oscillated signal φ as an output signal, an intended counter value altering circuit 103, and a binary counter circuit 104, a writing or erasing time interval is elongated by the output signal LVD, when the power supply voltage becomes lower than the predetermined level.

4 Claims, 7 Drawing Sheets

COMPACT SEMICONDUCTOR MEMORY DEVICE CAPABLE OF PREVENTING INCOMPLETE WRITING AND ERASING

BACKGROUND OF THE INVENTION

This invention relates to a semiconductor memory device and, in particular, to a non-volatile semiconductor memory device including a writing or erasing time interval determining circuit.

Conventionally, in the non-volatile semiconductor memory device, such as an electrically erasable programmable read only memory (EEPROM), a data writing or erasing time interval is determined by a pulse signal having a predetermined pulse width. The pulse width is determined during design processes for development of the non-volatile semiconductor memory device. The pulse width is also determined based on a result of samples test. When the pulse width is determined in the above-mentioned manners, a method of controlling the pulse width is generally employed in order to prevent incomplete writing or erasing operations. In the method, the pulse width is determined to have a spare time so that data writing or erasing operation is completed in a memory cell.

In addition to the method of controlling the writing or erasing operation in which a predetermined writing or erasing time interval is reserved, another method of controlling writing or erasing operation is proposed in Japanese Unexamined Patent Publication No. Sho 60-236195, namely, 236195/1985, as will later be described in detail.

However, even in the aforesaid methods of controlling the writing or erasing operation, it is difficult that incomplete data writing or erasing operation is perfectly prevented.

In the method of controlling the writing or erasing operation in which the predetermined writing or erasing time interval is reserved, the above-mentioned spare time is determined so as not to be too long in view of users' requirements. When a power source voltage is reduced, it takes a long time that the writing or erasing operation is completely finished. As a result, it becomes impossible that the writing or erasing operation is completely finished within the above-mentioned predetermined pulse width. Thus, the data writing or erasing operation sometimes becomes incomplete in the memory cell. For example, let it be presumed that the writing operation needs 2 ms at a power source voltage of 5.0 V. It may be considered that the predetermined pulse width T of 4 ms has an enough spare time. However, it turns out that the writing operation needs 7 ms at a power source voltage of 3.5 V, although the pulse width T becomes not more than 4.75 ms. It is therefore inevitable that incomplete data writing is caused to occur.

Similar problems cannot be avoided even in the method of controlling writing or erasing operation proposed in the above-referenced Japanese Unexamined Patent Publication No. Sho 60-236195.

SUMMARY OF THE INVENTION

It is therefore an object of this invention to provide a semiconductor memory device, in which the incomplete data writing or erasing operation can be perfectly prevented.

Other objects will become clear as the description proceeds.

According to an aspect of this invention, there is provided a semiconductor memory device comprising: an oscillator which produces an oscillated output signal; a binary counter circuit which is electrically connected to the oscillator and which counts the oscillated output signal; and a writing/erasing time interval determining circuit which produces a pulse signal having a pulse width deciding a predetermined writing/erasing time interval; the writing/erasing time interval determining circuit including: a power supply voltage decision circuit which senses a power supply voltage to detect whether or not the power supply voltage is higher than a predetermined level and which produces an output detected signal; and altering means for altering the pulse width in response to the output detected signal.

The altering means may comprise an intended counter value altering circuit for altering the intended counter value into another value larger than the intended counter value when the power supply voltage is lower than the predetermined level.

The altering means may also comprise a period altering circuit for altering an oscillation period of the oscillator into another period longer than the oscillation period when the power supply voltage is lower than the predetermined level.

DESCRIPTION OF THE PREFERRED EMBODIMENTS

Figure 1:
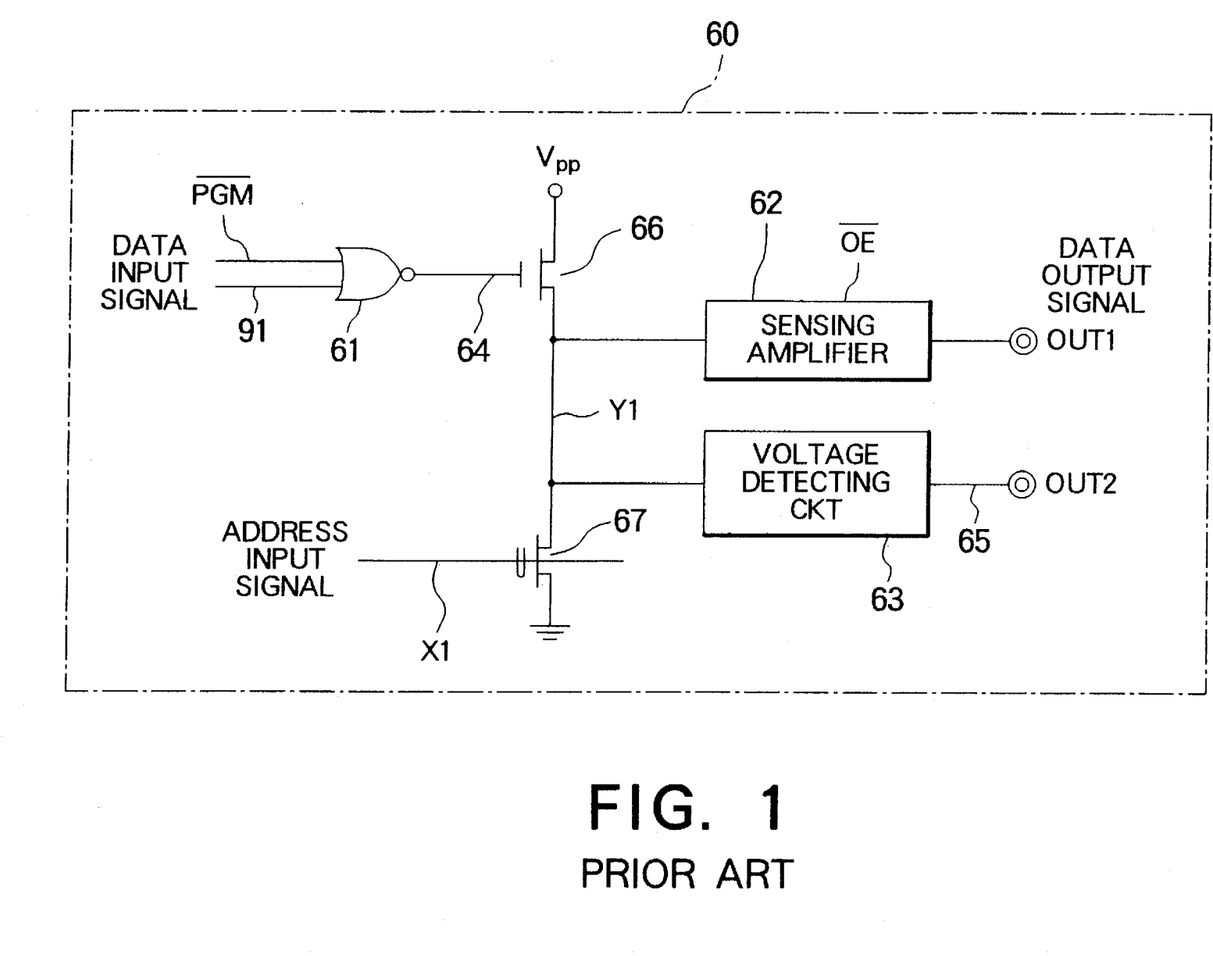
FIG. 1 is a circuit diagram of a conventional semiconductor memory device.
Figure 2:
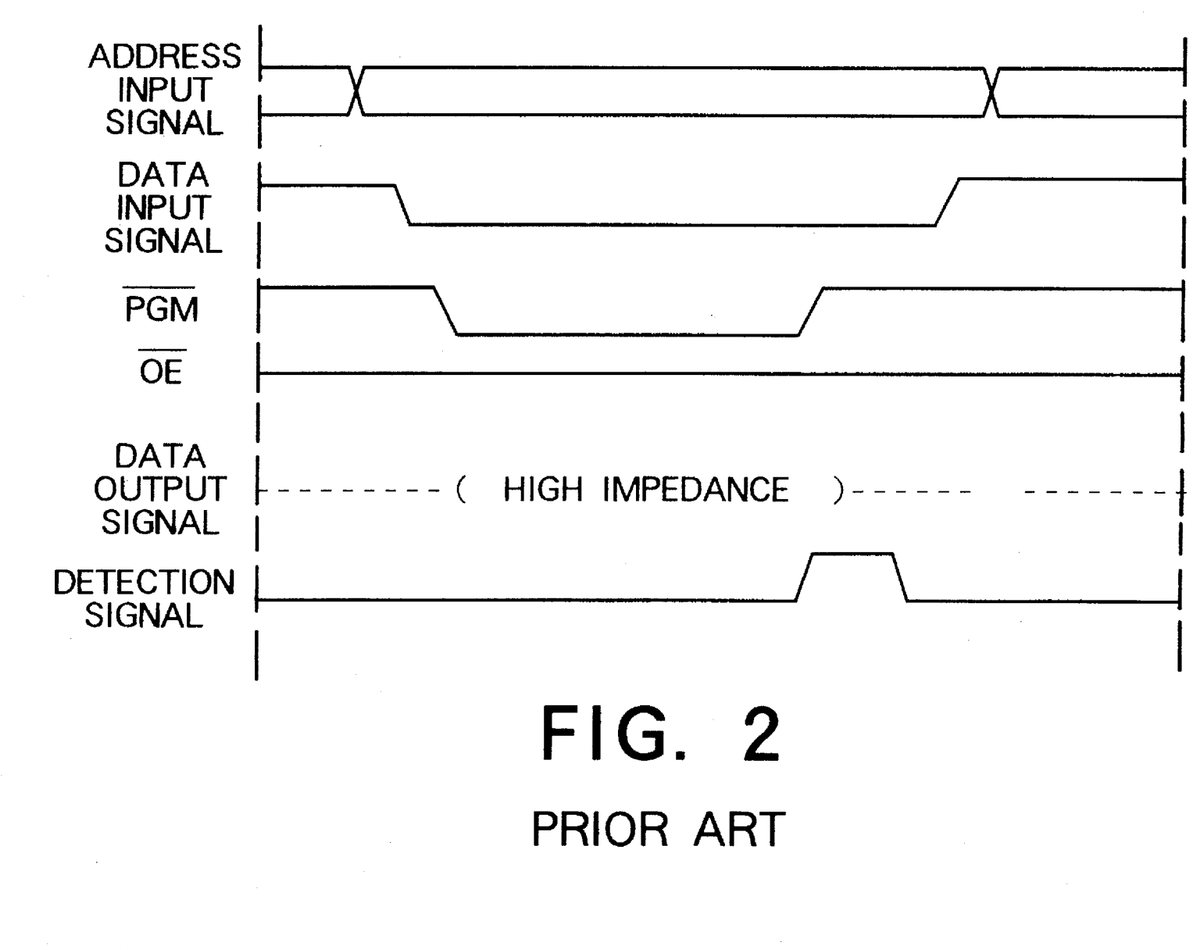
FIG. 2 shows a timing chart for explaining the method of controlling writing or erasing operation in the conventional semiconductor memory device illustrated in FIG. 1.

Referring to FIGS. 1 and 2, description is, at first, made about a conventional semiconductor memory device disclosed in Japanese Unexamined Patent Publication No. Sho 60-236195 for a better understanding of the present invention.

As illustrated in FIG. 1, the conventional semiconductor memory device 60 comprises a NOR gate 61, a memory cell 67, a load transistor 66, a sensing amplifier 62 and a voltage detecting circuit 63.

The NOR gate 61 is supplied with a data input signal 91 and a program input signal $\overline{PGM}$ to produce a writing control signal 64 as an output signal. The memory cell 67 is made of an N-channel insulated gate field effect transistor of which a drain electrode is electrically connected to a column line Y1, a source electrode is grounded, and a gate electrode is electrically connected to a row line X1 to have a floating gate electrode. The load transistor 66 is made of an N-channel insulated gate field effect transistor of which a drain electrode is electrically connected to a power supply Vpp, a source electrode is electrically connected to a column line Y1, and a gate electrode is electrically connected to the NOR gate 61. The sensing amplifier 62 senses a potential of the column line Y1 during a reading access to the memory cell 67 and supplies the potential to a data output terminal OUT1 as a memory data. The voltage detecting circuit 63 detects when the potential of the column line Y1 comes up to a predetermined potential during a writing access to the memory cell 67 and supplies a detection signal 65 to an output terminal OUT2.

Referring to FIG. 2 with reference to FIG. 1 continued, description is made about an operation of the conventional semiconductor memory device 60.

When data is written to the memory cell 67, the data output terminal OUT1 is under a high-impedance condition by previously supplying an output enable signal input terminal $\overline{OE}$ with a signal of a high level. Let a data input signal be a writing data "0", namely, a signal of a low level through the data output terminal OUT1. Also, let a program input signal $\overline{PGM}$ be a low level. The writing control signal 64 thereby becomes a high level to make the load transistor 66 be "on". Accordingly, a writing current is supplied to the memory cell 67 to start the writing thereto.

The writing current supplied to the memory cell 67 is dependent upon a charge Qf of electrons doped and accumulated in the floating gate electrode of the memory cell 67. The potential of the column line Y1 at this time is principally determined by load characteristics of the load transistor 66 and the above-mentioned writing current. Now, let a quantity of charge enough to complete the writing be a value Qs. Then, it can be decided that electrons having the charge quantity Qs are doped and accumulated in the floating gate electrode of the memory cell 67, when the potential of the column line Y1 raises up to a potential Vs of the column line, which is principally determined by the value Qs. The voltage detecting circuit 63 produces the detection signal 65 when the potential of the column line raises gradually to come up to the value Vs by progress of the writing operation. In response to the detection signal 65, an external programming device (not shown) connected to the conventional semiconductor memory device 60 make the program input signal $\overline{PGM}$ be a high level to finish the writing operation. Thus, in the conventional semi-conductor memory device 60, the charge of required quantity is efficiently doped into the floating gate electrode of the memory cell 67 to prevent the incomplete writing operation.

However, it is a serious problem that the conventional semiconductor memory device 60 illustrated in FIG. 1 cannot be applied to electrical erasable and programmable read only memory (EEPROM). This is because the voltage of drain in the memory cell becomes 0 V at the erasing time. In addition, in the conventional semiconductor memory device, a plurality of voltage detecting circuits are required at the number equal to that of bits subjected to the writing operation at the same time. This causes another problem that the voltage detecting circuits occupy a large area in the conventional semiconductor memory device. Furthermore, when the writing operation to the memory cell is carried out, a threshold level of the memory cell is converged to a certain value while the drain voltage of the memory cell is also converged to another certain value. Some risk is caused to occur, if an intended potential of the voltage detecting circuit is predetermined to a potential of a deeper writing level. For example, a writing finish signal is not produced or writing is incomplete due to too early finish of the writing. Similar risk is also caused to occur, if the intended potential of the voltage detecting circuit or the converged value of the drain voltage of the memory cell is drifted due to unevenness of diffusion.

Figure 3:
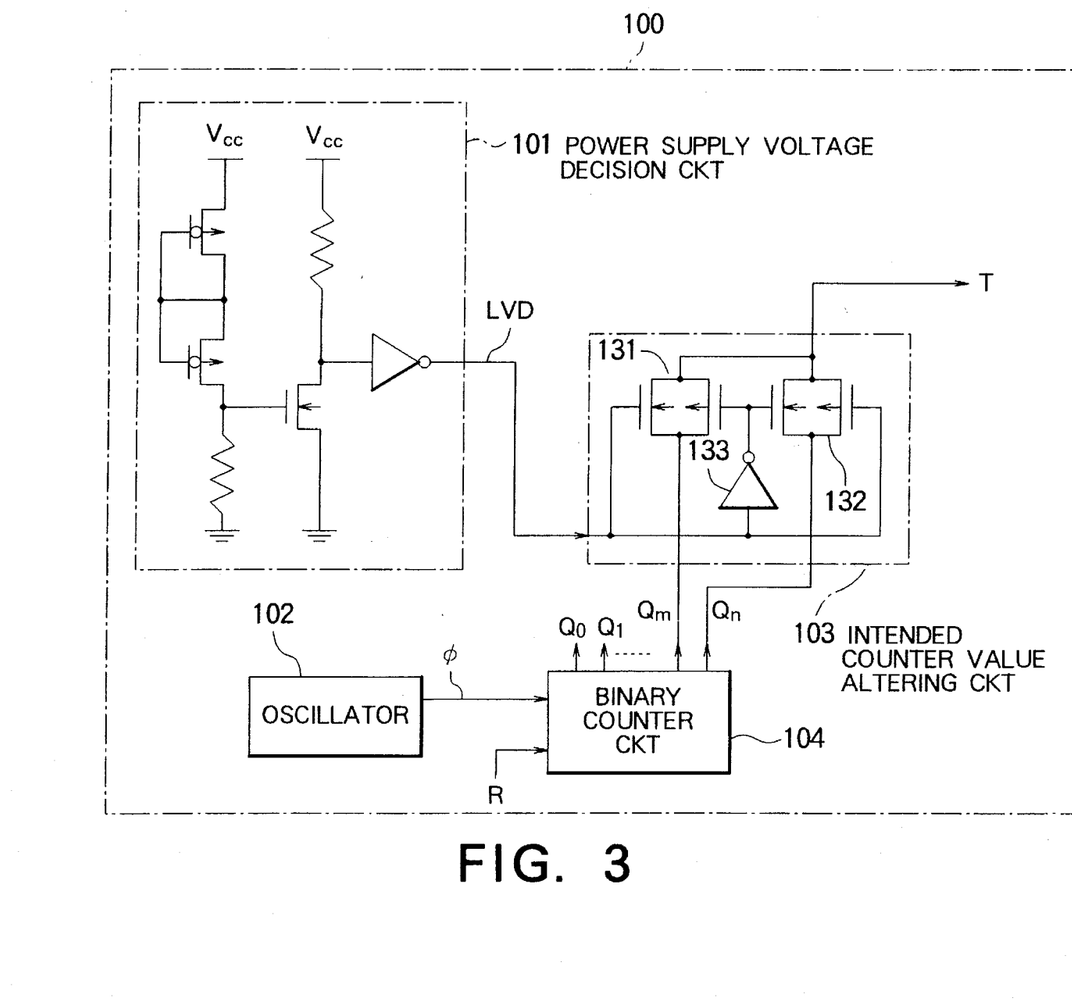
FIG. 3 is a circuit diagram of a semiconductor memory device according to a first embodiment of the present invention.
Figure 4:
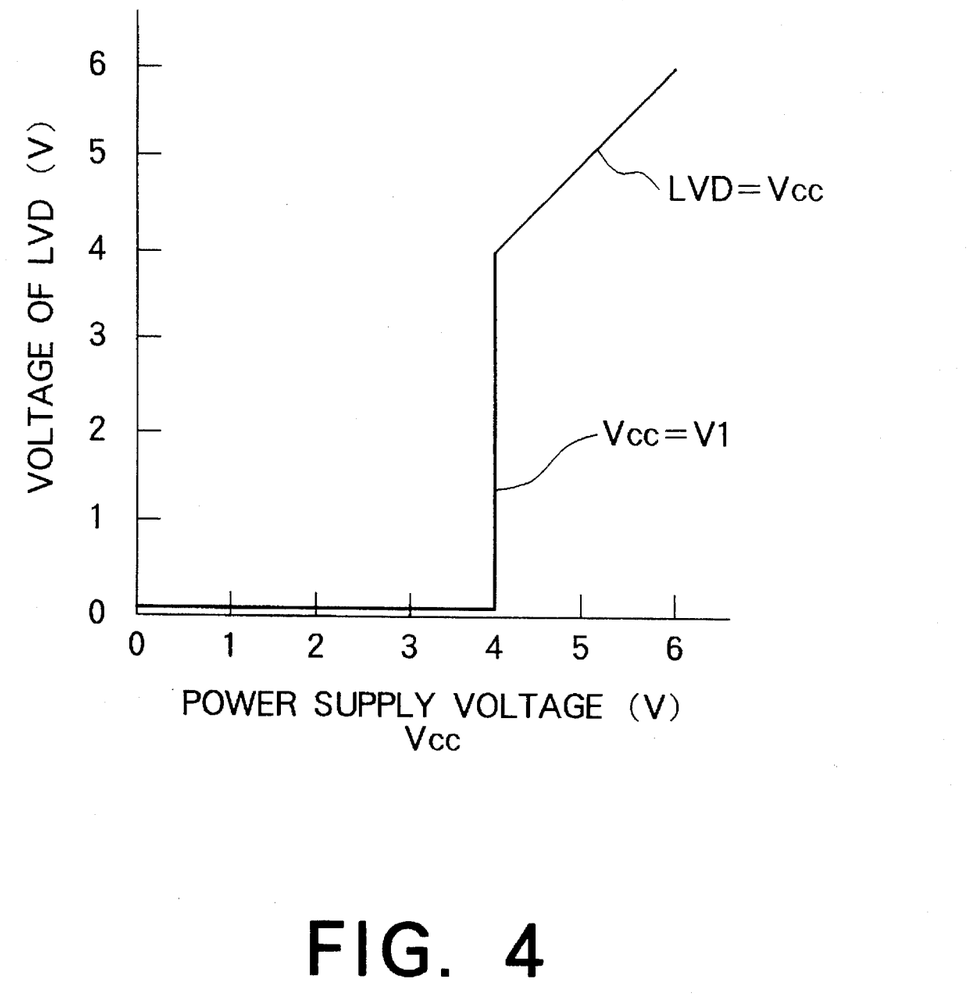
FIG. 4 shows an input/output characteristic for explaining an operation of a decision circuit 101 included in the semiconductor memory device illustrated in FIG. 3.
Figure 5:
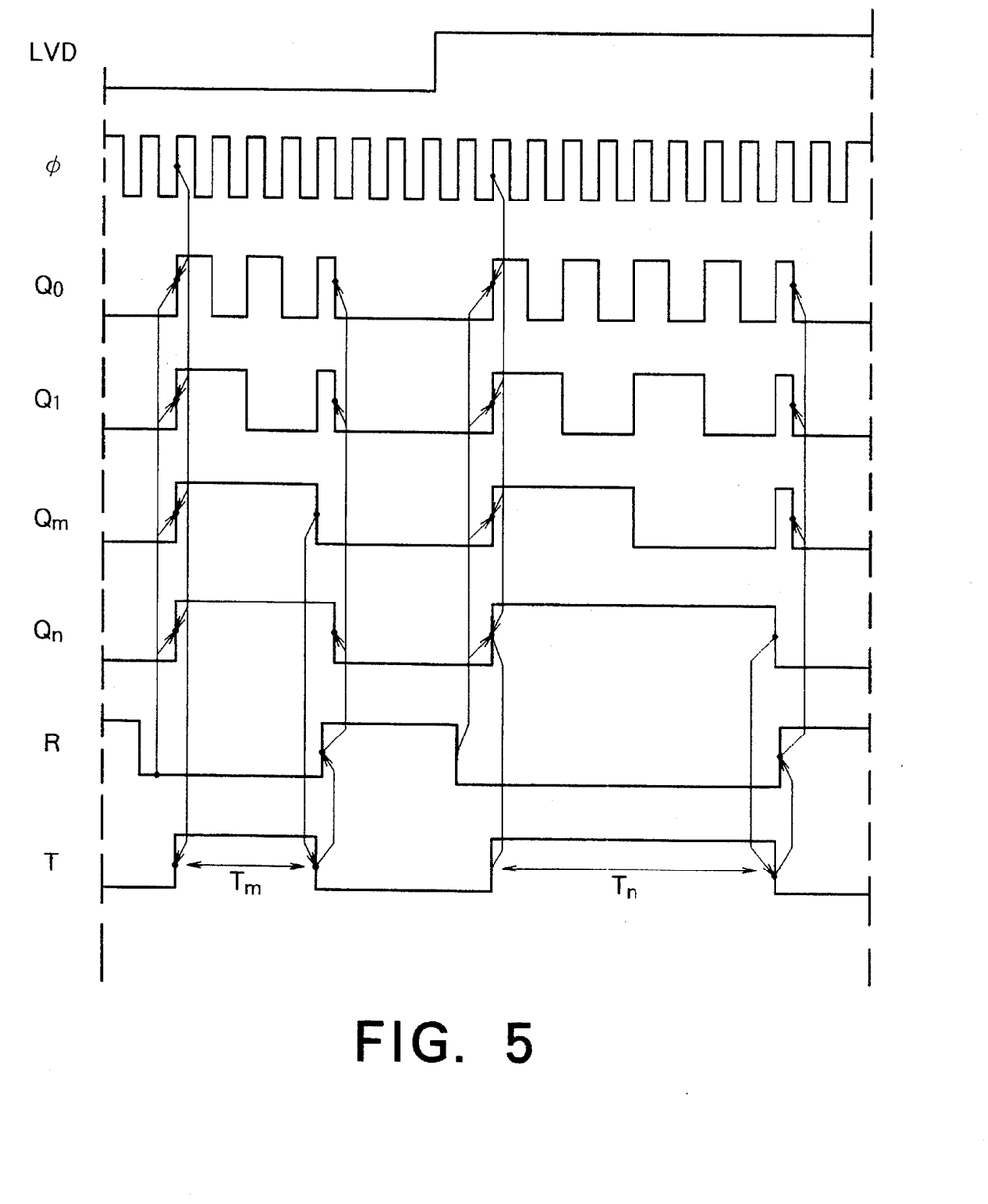
FIG. 5 shows a timing chart for explaining a method of controlling writing or erasing operation in the semiconductor memory device illustrated in FIG. 3.

Referring to FIGS. 3 to 5, description will proceed to a semiconductor memory device according to a first embodiment of the present invention.

As illustrated in FIG. 3, the semiconductor memory device 100 comprises a power supply voltage decision circuit 101, an oscillator 102, an intended counter value altering circuit 103, and a binary counter circuit 104.

The power supply voltage decision circuit 101 senses a power supply voltage to detect whether or not the power supply voltage is higher than a predetermined level. As a result of the decision, the power supply voltage decision circuit 101 produces an output signal LVD. The oscillator 102 is electrically connected to the binary counter circuit 104 to produce an oscillated signal φ as an output signal. The binary counter circuit 104 comprises a down-counter of which all bits are initialized into "0" by a reset signal R. In the binary counter circuit 104, all the bits are changed into "1" at the first positive edge of a counter pulse φ depicted in FIG. 5, when the reset signal R is released. Thereafter, the bits are decreased by turns. The intended counter value altering circuit 103 is supplied, as input signals, with the m bit and the n bit output signals of the binary counter circuit 104 to select one of the m bit and the n bit signals by a signal LVD shown in FIG. 5. The selected output signal of the intended counter value altering circuit 103 is used not only as a control signal for controlling the binary counter circuit 104 but also as a writing or erasing pulse signal T. In this embodiment, the n bit signal of the binary counter circuit 104 is defined as an upper grade bit per one bit than the m bit signal thereof.

Referring to FIG. 4 with reference to FIGS. 3 and 5 continued, description is made about an operation of the semiconductor memory device 100.

In FIG. 4, the power supply voltage is shown in the horizontal axis of abscissa while the potential of the signal LVD is shown in the vertical axis thereof. As depicted in FIG. 4, the signal LVD becomes Vcc (high) level when the power supply voltage Vcc exceeds the predetermined voltage V1 (in FIG. 4, V1 is 4 V).

In FIG. 5, when the semiconductor memory device 100 starts the writing or erasing operation, at first, the reset signal R of the binary counter circuit 104 becomes a low level. Next, in the binary counter circuit 104, all the bits are changed into "1" at the first positive edge of the counter pulse φ. Thereafter, the bits of the binary counter circuit 104 are decreased, every time each positive edge of the counter pulse φ is supplied to the binary counter circuit 104.

Herein, when the power supply voltage is higher than a predetermined level V1, only a short time interval is required for the writing or erasing operation to the memory cell. It is enough that a writing or erasing pulse signal T has a short pulse width. At this time, the output signal LVD is a high level. As a result, a transfer circuit 131 is conducted while a transfer circuit 132 is closed in the intended counter value altering circuit 103 illustrated in FIG. 3. Accordingly, the m bit output signal Qm of the binary counter circuit 104 is produced as a pulse signal T. In FIG. 5, the writing or erasing time interval is Tm indicated when the output signal LVD is a high level. The reset signal R is produced at a trailing edge of the writing or erasing pulse signal T to reset the binary counter circuit 104. The semiconductor memory device 100 then waits for a start signal of a next writing or erasing operation cycle.

On the other hand, when the power supply voltage is lower than a predetermined level V1, a long time interval is required for the writing or erasing operation to the memory cell. It becomes necessary that a writing or erasing pulse signal T has a long pulse width. At this time, the output signal LVD is a low level. As a result, the transfer circuit 131 is closed while the transfer circuit 132 is conducted in the intended counter value altering circuit 103. Accordingly, the n bit output signal Qn of the binary counter circuit 104 is produced as the pulse signal T. In FIG. 5, the writing or erasing time interval is Tn indicated when the output signal LVD is a low level. As a relationship between n and m is n=m+1 in this embodiment, it is required that the pulse signal Tn has a pulse width twice as long as that of the pulse signal Tm.

As described above, in this embodiment, the counter value of the binary counter circuit 104 is changed into a value twice as large as the previous value to produce a writing or erasing pulse signal having a pulse width twice as long as that of the previous pulse signal. The writing or erasing time interval is thereby elongated to prevent incomplete writing or erasing operation in the aforesaid EEPROM. Further, it is possible that the semiconductor memory device 100 is realized by a compact circuit layout consisting merely of a counter, two transfer circuits and an inverter circuit. Consequently, it can be achieved that the semiconductor memory device 100 is realized without an increase of area of the circuits.

Figure 6:
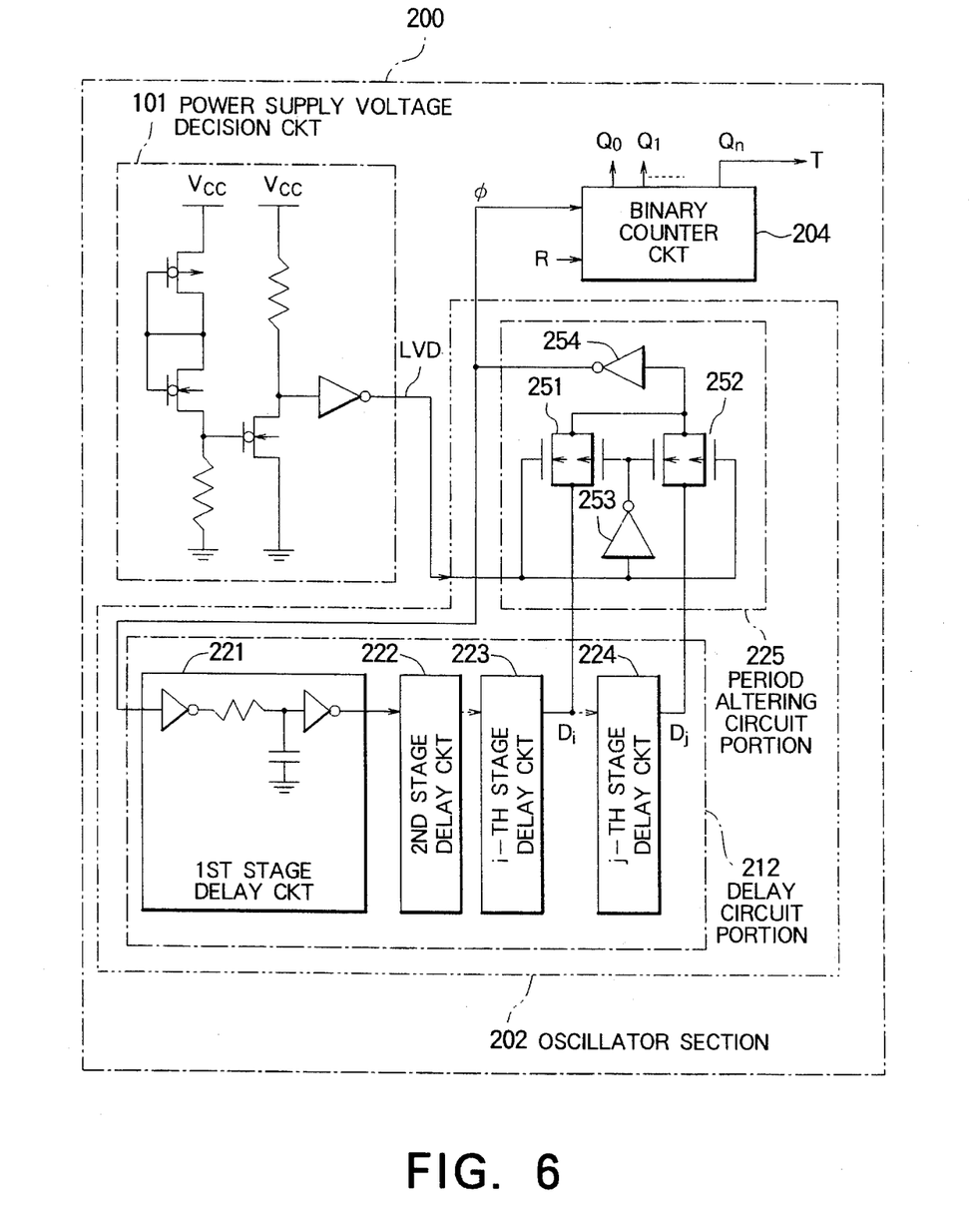
FIG. 6 is a circuit diagram of a semiconductor memory device according to a second embodiment of the present invention.
Figure 7:
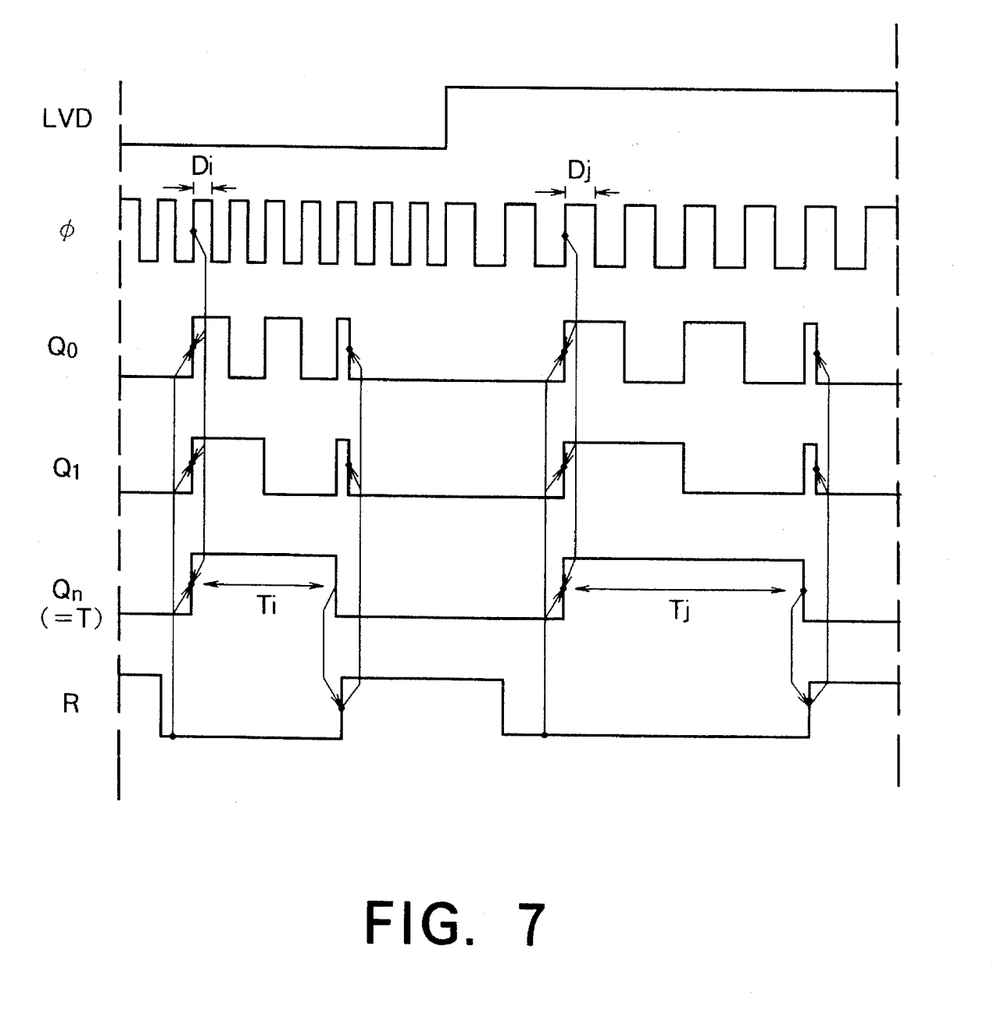
FIG. 7 shows a timing chart for explaining a method of controlling writing or erasing operation in the semiconductor memory device illustrated in FIG. 6.

Referring to FIGS. 6 and 7, description will proceed to a semiconductor memory device 200 according to a second embodiment of the present invention. The semiconductor memory device 200 has some portions similar to those of the semiconductor memory device 100 mentioned above. Similar portions are designated by like reference numerals.

As illustrated in FIG. 6, the semiconductor memory device 200 comprises a power supply voltage decision circuit 101, an oscillator section 202, and a binary counter circuit 204.

Like the first embodiment, the power supply voltage decision circuit 101 senses a power supply voltage to detect whether or not the power supply voltage is higher than a predetermined level. As a result of the decision, the power supply voltage decision circuit 101 produces an output signal LVD.

In this embodiment, the oscillator section 202 comprises a delay circuit portion 212 and a period altering circuit portion 225. The delay circuit portion 212 has a 1st stage delay circuit 221, a 2nd stage delay circuit 222, ..., an i-th stage delay circuit 223, ..., a j-th stage delay circuit 224 sequentially connected to each other. The period altering circuit portion 225 is supplied with output signals of both the i-th stage and the j-th stage delay circuits 223 and 224 as input signals to select one of the output signals of both the i-th stage and the j-th stage delay circuits 223 and 224 by the output signal LVD of the power supply voltage decision circuit 101 and produce a selected signal of either the i-th stage or the j-th stage delay circuit 223 or 224. The selected output signal of one of the delay circuits is inverted by an inverter 254 to produce an inverted output signal $\phi$. The inverted output signal $\phi$ is in turn supplied to an input terminal of the 1st stage delay circuit 221 as a feedback. As a result, an oscillation is carried out at a period twice as long as a sum of the delay time intervals. Count down operations are carried out in the binary counter circuit 204 by receiving the inverted output signal $\phi$ as an input signal. The output signal Qn of the binary counter circuit 204 is used as a writing or erasing pulse signal T.

Referring to FIG. 7 with reference to FIG. 6 continued, description is made about an operation of the semiconductor memory device 200.

In FIG. 7, when the semiconductor memory device 200 starts the writing or erasing operation, like in the semiconductor memory device 100, the reset signal R of the binary counter circuit 204, at first, becomes a low level. Next, count down operations are carried out in the binary counter circuit 204. The output signal Qn of the binary counter circuit 204 is used as a writing or erasing pulse signal T. The reset signal R is produced at a trailing edge of the writing or erasing pulse signal T to reset the binary counter circuit 204. The semi-conductor memory device 200 then waits for a start signal of a next writing or erasing operation cycle.

In the semiconductor memory device 200, when the power supply voltage is higher than a predetermined level V1, the output signal LVD becomes a high level. The transfer circuit 251 is then conducted. The output signal of the i-th stage delay circuit 223 is thereafter selected as a selected output signal. Accordingly, the selected output signal is inverted by the inverter 254 to produce an inverted output signal $\phi$ as an oscillated output signal $\phi$.

On the other hand, when the power supply voltage is lower than a predetermined level V1, the output signal LVD becomes a low level. The transfer circuit 252 is then conducted. The output signal of the j-th stage delay circuit 224 is thereafter selected as a selected output signal. Accordingly, the selected output signal is inverted by the inverter 254 to produce an inverted output signal $\phi$ as an oscillated output signal $\phi$.

Herein, it is assumed that the delay time produced between the input of the 1st stage delay circuit 221 and the output of the i-th stage delay circuit 223 is Di and that the delay time produced between the input of the 1st stage delay circuit 221 and the output of the j-th stage delay circuit 224 is Dj. Accordingly, a period of the oscillated output signal $\phi$ is changed from 2Di into 2Dj, when the output signal LVD changes from a high level into a low level. As a result, the output signal Qn of the binary counter circuit 204, which counts down the oscillated output signal $\phi$, is changed by the output signal LVD. The writing or erasing pulse signal T indicates the writing or erasing pulse width Ti when the power supply voltage is higher than the predetermined level V1. On the contrary, the writing or erasing pulse signal T indicates the writing or erasing pulse width Tj when the power supply voltage is lower than the predetermined level V1. Herein, the delay time Di and Dj are proportional to the pulse widths Ti and Tj of the writing or erasing pulse signal, respectively. Consequently, compared with the first embodiment, the proportion between the pulse widths Ti and Tj can be flexibly determined by deciding the proportion between the delay time Di and Dj into a desired value.

As described above, according to the semi-conductor memory devices 100 and 200 of the present invention, the following meritorious effects can be achieved. For example, it is possible that the writing or erasing time interval is elongated by the output signal of the power supply voltage decision circuit 101 when the power supply voltage becomes lower. As a result, the operating range can be extended for the writing or erasing operation. Therefore, characteristics against the incomplete writing or erasing of the memory data can be reinforced with respect to unevenness of manufacturing conditions, deterioration with age, and fluctuation of operating voltage. Furthermore, the circuit for extending the writing or erasing time intervals can be realized as a compact circuit. Consequently, a chip area is not so increased when the semiconductor memory devices 100 and 200 of the present invention are employed.

While this invention has thus far been described in conjunction with only several embodiments thereof, it will now be readily possible for one skilled in the art to put this invention into effect in various other manners. For example, the semiconductor memory device of the present invention can be applied to a flush memory. Moreover, in the embodiments mentioned above, description is made about a circuit for altering the writing or erasing time intervals by sensing the power supply voltage. However, it may be applied to the present invention that a characteristic condition other than the power supply voltage is sensed for altering the writing or erasing time intervals. Furthermore, the present invention can be extended to a circuit which determines a plurality of writing or erasing time intervals and alternates thereof by a combination of the characteristic conditions, that is, the power supply voltage and the other characteristic condition mentioned above.

What is claimed is:

1. A semiconductor memory device comprising:
   an oscillator which produces an oscillated output signal;
   a binary counter circuit which is electrically connected to said oscillator and which counts said oscillated output signal; and
   a writing/erasing time interval determining circuit which produces a pulse signal having a pulse width deciding a predetermined writing/erasing time interval, said writing/erasing time interval determining circuit including:
   a power supply voltage decision circuit which senses a power supply voltage to detect whether or not the power supply voltage is higher than a predetermined level and which produces an output detected signal; and
   altering means for altering said pulse width in response to said output detected signal.

2. A semiconductor memory device as claimed in claim 1, wherein said altering means comprises an intended counter value altering circuit for altering said intended counter value into another value larger than said intended counter value when said power supply voltage is lower than said predetermined level.

3. A semiconductor memory device as claimed in claim 1, wherein said altering means comprises a period altering circuit for altering an oscillation period of said oscillator into another period longer than said oscillation period when said power supply voltage is lower than said predetermined level.

4. A writing/erasing time interval determining circuit which is for use in a semiconductor memory device and which produces a pulse signal of a pulse width for deciding a predetermined writing/erasing time interval, comprising:
   a power supply voltage decision circuit which senses a power supply voltage to detect whether or not the power supply voltage is higher than a predetermined level and which produces an output detected signal; and
   altering means for altering said pulse width in response to said output detected signal.

* * * * *